United States Patent
Riley et al.

(10) Patent No.: US 7,656,237 B2
(45) Date of Patent: Feb. 2, 2010

(54) METHOD TO GATE OFF PLLS IN A DEEP POWER SAVING STATE WITHOUT SEPARATE CLOCK DISTRIBUTION FOR POWER MANAGEMENT LOGIC

(75) Inventors: Mack Wayne Riley, Austin, TX (US); Daniel Lawrence Stasiak, Austin, TX (US); Michael Fan Wang, Austin, TX (US); Stephen Douglas Weitzel, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 872 days.

(21) Appl. No.: 11/002,559

(22) Filed: Dec. 2, 2004

(65) Prior Publication Data

US 2006/0119445 A1    Jun. 8, 2006

(51) Int. Cl.
    *H03L 7/095* (2006.01)
(52) U.S. Cl. .............. 331/25; 331/DIG. 2; 327/157; 713/323
(58) Field of Classification Search ........... 331/DIG. 2, 331/25; 713/323; 327/157
    See application file for complete search history.

(56) References Cited

U.S. PATENT DOCUMENTS

| 5,594,735 | A  | * | 1/1997 | Jokura ........................ 370/337 |
| 6,694,441 | B1 | * | 2/2004 | Sethia ........................ 713/322 |
| 6,763,060 | B1 | * | 7/2004 | Knapp ........................ 375/219 |
| 6,990,165 | B2 | * | 1/2006 | Boerstler et al. ............ 375/376 |
| 7,036,032 | B2 | * | 4/2006 | Mizuyabu et al. ........... 713/323 |

* cited by examiner

*Primary Examiner*—Robert Pascal
*Assistant Examiner*—James E Goodley
(74) *Attorney, Agent, or Firm*—Matthew B. Talpis

(57) ABSTRACT

An apparatus, a method, and a computer program are provided to gate a Phased Locked Loop (PLL). In microprocessors, the clock distribution system can account for a substantial amount of power consumption. Gating the PLLs, however, has been difficult because of the usual requirement for a separate clock for control logic and because the PLL requires timed to reacquire phase/frequency lock. Therefore, lock detection logic can be employed to allow the PLL to reacquire phase/frequency lock. Additionally, signals from external devices and the processor can be employed to gate the PLL and allow the processor to be awakened without a need for a separate clock.

19 Claims, 2 Drawing Sheets

METHOD TO GATE OFF PLLS IN A DEEP POWER SAVING STATE WITHOUT SEPARATE CLOCK DISTRIBUTION FOR POWER MANAGEMENT LOGIC

CROSS-REFERENCED APPLICATIONS

This application relates to co-pending U.S. patent application entitled "DEEP POWER SAVING BY DISABLING CLOCK DISTRIBUTION WITHOUT SEPARATE CLOCK DISTRIBUTION FOR POWER MANAGEMENT LOGIC" Ser. No. 11/002,551, filed concurrently herewith.

FIELD OF THE INVENTION

The present invention relates generally to clocking distribution, and more particularly, to clock distribution gating in a microprocessor.

DESCRIPTION OF THE RELATED ART

In conventional microprocessors, power consumption control has been evolving. Within microprocessors, there are three types of phenomenon that result in power consumption: direct current (DC) leakage, the clock, and alternating current (AC) usage. DC leakage is a product of the devices themselves losing charge when the system is powered. For example, thin film capacitors within a microprocessor will lose charge due to a leakage current. The clocking distribution system, mesh, or tree consumes power due the constant toggling that occurs, and the AC usage is the switching power required for active switching of the logic in the microprocessor.

Because of temperature requirements, limitations of power sources, limitations of the device, as well as other factors, there is a constant strived for reduction in the power consumption of the microprocessors. These power reduction solutions have taken many different forms. For example, disengaging entire sections of logic on the microprocessor when not in use for extended periods of time is often employed. Also, improving the quality with which the microprocessors are manufactured is employed.

However, several techniques have been employed to reduce power consumption by the clocking distribution system. The clocking distribution system can often consume 15% or more of the total chip power. Therefore, it would be desirable to gate off the clocking distribution when the processor is in a deep power saving mode. However, pervasive logic controlling the gating of the clock distribution requires a clock to operate. Some conventional solutions utilize a separate clock for the control logic so that the control logic functions while the main clock distribution is gated off.

Having a separate clock for the control logic, however, has several drawbacks. Designing such a clocking system is difficult, requiring many man-hours. Control logic is limited to the separate clock distribution physical boundary, making integration difficult. Additionally, the separate clock distribution may be asynchronous to the main clock mesh, creating difficulty for signals crossing the synchronous-asynchronous boundary.

Therefore, there is a need for a method and/or apparatus for reducing power consumption by a clock distribution system the addresses at least some of the problems associated with conventional solutions.

SUMMARY OF THE INVENTION

The present invention provides a method and a computer program for disabling clock distribution and gating a Phased Locked Loop (PLL) while a processor is in power savings mode. A plurality of power mode signals is first generated. Then, based on the plurality of power mode signals, the PLL is gated.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
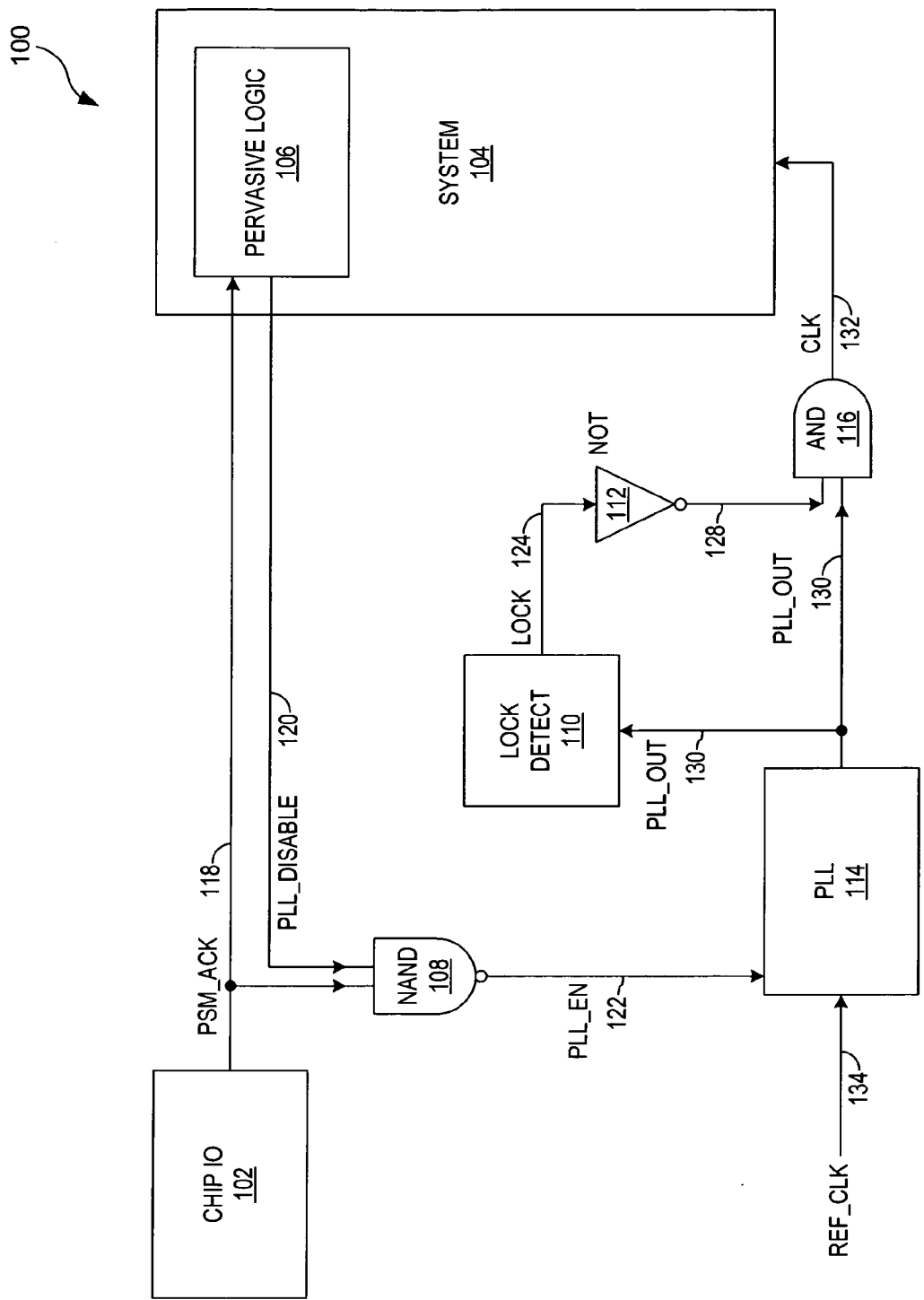
FIG. 1 is a block diagram depicting a chip that includes clock gating.

Referring to FIG. 1 of the drawings, the reference numeral 100 generally designates a block diagram depicting a chip that includes clock gating. The chip 100 comprises a chip IO 102, a system for receiving the clocking signals 104, pervasive logic 106 within the system 104, a NAND gates 108, an AND gate 116, a phased locked loop (PLL) 114, a lock detector 110, and an inverter 112.

For the chip 100 to operate, the PLL 114 generates a clocking signal for the system 104. The PLL 114 receives a reference clock signal (REF_CLK) through the communication channel 134 to generate a clocking signal. The PLL 114 then outputs an output signal (PLL_OUT) through the communication channel 130. Then, when conditions are normal and the PLL 114 is in phase/frequency lock, the AND gate 116 receives PLL_OUT and outputs a clock signal (CLK) to the system 104 through the communication channel 132.

However, to gate off CLK when the system is in power save mode, the PLL 114 is disabled. The chip IO 102 provides a power save mode acknowledge signal (PSM_ACK) through the communication channel 118 to the pervasive logic 106 and the NAND gate 108. The pervasive logic 106 then provides a PLL disable signal (PLL_DISABLE) to the NAND gate 108 through the communication channel 120. The output signal of the NAND gate 108 (PLL_EN) is then transmitted to the PLL 114 through the communication channel 122. If both PSM_ACK and PLL_DISABLE are logic high, then PLL_EN transitions to logic low, disabling the PLL 114.

A problem with deactivating the PLL 114 is the fact that the PLL 114 has to reach phase/frequency lock for proper CLK signal to reach the system 104. When the PLL 114 is reactivated, the PLL_OUT is also transmitted to the lock detector 110 through the communication channel 130. The output of the lock detector (LOCK) 124 is transmitted to the inverter 112 through the communication channel 124, and the inverted LOCK signal is relayed to the AND gate 116 through communication channel 128. When the PLL achieves phase/frequency lock the inverted LOCK signal transitions to logic high. Hence, the AND gate 116 prevents transmission of the CLK signal until phase/frequency lock is achieved.

Figure 2:
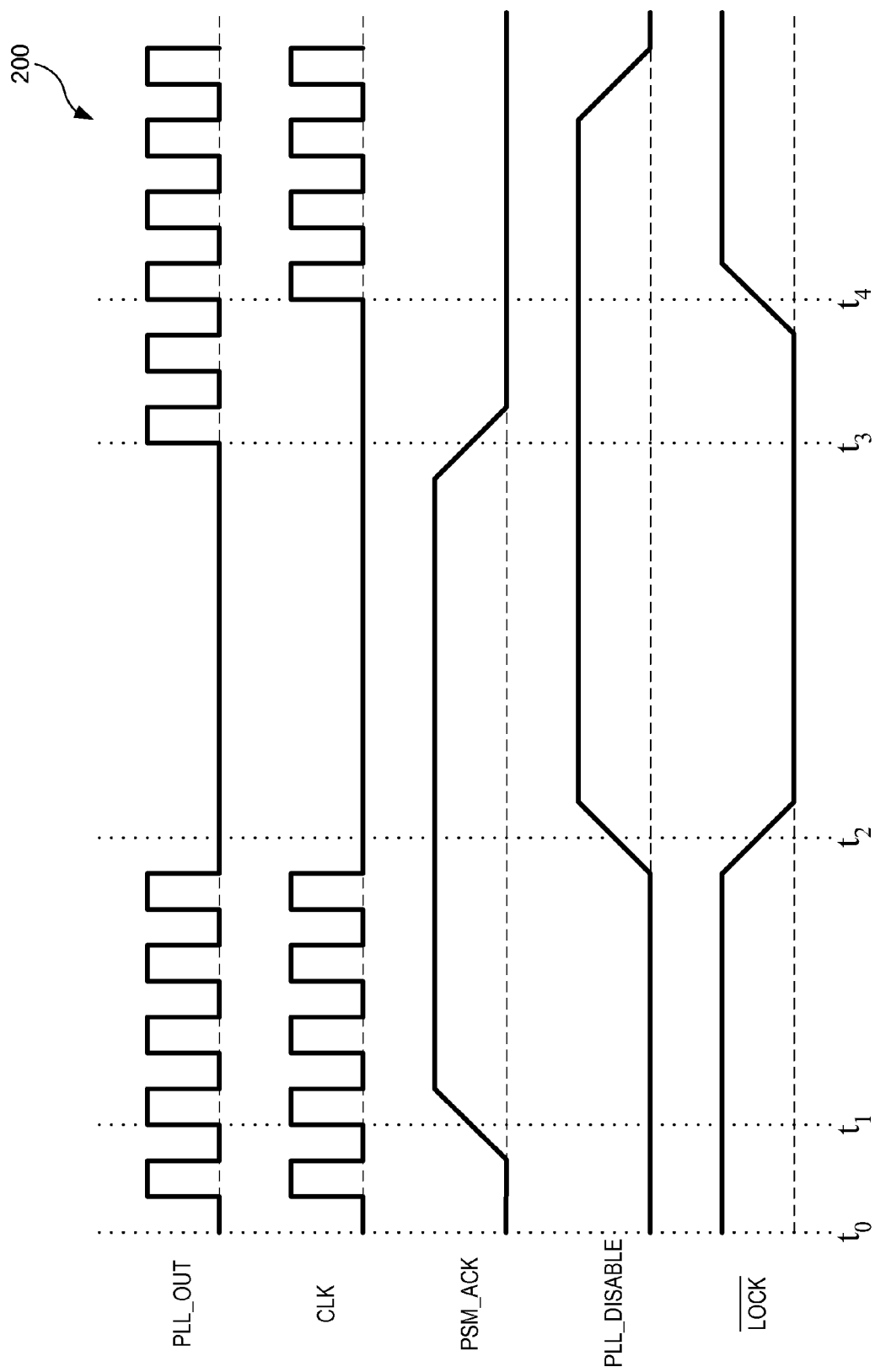
FIG. 2 is a timing diagram depicting the operation of the clock gating circuitry.

A timing diagram, however, can be employed to better illustrate the functionality of the chip 100. Referring to FIG. 2 of the drawings, the reference numeral 200 generally designates a timing diagram depicting the operation of the clock gating circuitry.

At $t_0$, the PLL_OUT and CLK are normal. However, at $t_1$, PSM_ACK transitions to logic high. The transition of PSM_ACK to logic high, though, is not enough to disable the PLL 114. Then at $t_2$, the PLL_DISABLE transitions to logic high. Thus, at $t_2$, the PLL 114 is disabled and transitions out of phase/frequency lock.

To restart PLL operation, PSM_ACK transitions back to logic low at $t_3$. Since PSM_ACK has transitioned to logic low, the PLL 114 is enabled once again. However, the PLL 114 does not instantaneously achieve phase/frequency lock. A short period of time is usually required for the PLL 114 to achieve phase/frequency lock. Therefore, between $t_3$ and $t_4$, the PLL 114 is attempting to achieve phase/frequency lock. At $t_4$, lock is achieved, evidenced by the inverted LOCK signal transitioning back to logic high; thus, the CLK begins to transmit normally again.

Specifically, the operation of the clock gating system is employed during a power save mode. Within this mode the clock distribution is shut down. Then, reactivation occurs as a result of an external handshake signal(s) that "wakes up" the processor. These handshake signals are level sensitive signals that are monitored while the processor is in power saving mode. Within the configuration of the chip 100 of FIG. 1, the handshake signals are monitored with static (combinational) logic instead of a separate clock distribution. Therefore, clock distribution that is not utilized can be disabled without having to employ a separate clock distribution.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus, comprising:
   a system logic unit coupled to receive a clock (CLK) signal and a power save mode acknowledge (PSM_ACK) signal, wherein the PSM_ACK signal is asserted in a power saving mode, and wherein the system logic unit is configured to perform a function dependent upon the CLK signal and to produce a phased lock loop disable (PLL_DISABLE) signal in response to the PSM_ACK signal;
   enable logic coupled to receive the PSM_ACK signal and the PLL_DISABLE signal, and configured to produce a phased lock loop enable (PLL_EN) signal dependent upon the PSM_ACK signal and the PLL_DISABLE signal;
   a phased locked loop (PLL) unit coupled to receive the PLL_EN signal and a reference clock (REF_CLK) signal, and configured to use the REF_CLK signal to produce a phased lock loop output (PLL_OUT) signal responsive to the PLL_EN signal;
   a lock detector unit coupled to receive the PLL_OUT signal and configured to produce a LOCK signal dependent upon the PLL_OUT signal; and
   transmission logic coupled to receive the LOCK signal and the PLL_OUT signal, and configured to produce the PLL_OUT signal as the CLK signal dependent upon the LOCK signal.

2. The apparatus as recited in claim 1, wherein the apparatus is a processor.

3. The apparatus as recited in claim 1, wherein the system logic unit comprises pervasive logic coupled to receive the PSM_ACK signal and configured to produce the PLL_DISABLE signal in response to the PSM_ACK signal.

4. The apparatus as recited in claim 1, wherein the enable logic is configured to assert the PLL_EN signal in the event the PSM_ACK signal is asserted and the PLL_DISABLE signal is asserted.

5. The apparatus as recited in claim 4, wherein the PSM_ACK signal and the PLL_DISABLE signal are active high signals such that the PSM_ACK signal and the PLL_DISABLE signal are logic 1 levels when asserted, and wherein the PLL_EN signal is an active low signal such that the PLL_EN signal is a logic 0 when asserted.

6. The apparatus as recited in claim 1, wherein the enable logic comprises a NAND logic gate.

7. The apparatus as recited in claim 1, wherein the LOCK signal is indicative of whether the PLL_OUT signal is locked to the REF_CLK signal in terms of both frequency and phase.

8. The apparatus as recited in claim 7, wherein the LOCK signal is an active high signal such that the LOCK signal is a logic 1 when the PLL_OUT signal is locked to the REF_CLK signal in terms of both frequency and phase.

9. The apparatus as recited in claim 1, wherein the transmission logic comprises a NOT logic gate and an AND logic gate.

10. The apparatus as recited in claim 9, wherein the NOT logic gate is coupled to receive the LOCK signal and configured to produce an inverted version of the LOCK signal, and wherein the AND logic gate is coupled to receive the PLL_OUT signal and the inverted version of the LOCK signal and is configured to produce the CLK signal.

11. A method for selectively producing a clock (CLK) signal, comprising:
- receiving a power save mode acknowledge (PSM_ACK) signal and responding to the PSM_ACK signal by producing a phased lock loop disable (PLL_DISABLE) signal, wherein the PSM_ACK signal is asserted in a power saving mode;
- receiving the PSM_ACK signal and the PLL_DISABLE signal and using the received PSM_ACK and PLL_DISABLE signals to produce a phased lock loop enable (PLL_EN) signal;
- receiving a reference clock (REF_CLK) signal and the PLL_EN signal and using the REF_CLK signal to produce a phased lock loop output (PLL_OUT) signal responsive to the PLL_EN signal;
- receiving the PLL_OUT signal and using the PLL_OUT signal to produce a LOCK signal dependent upon the PLL_OUT signal, wherein the LOCK signal is indicative of whether the PLL_OUT signal is locked to the REF_CLK signal in terms of both frequency and phase; and
- receiving the PLL_OUT signal and the LOCK signal and producing the PLL_OUT signal as the CLK signal dependent upon the LOCK signal.

12. The method as recited in claim 11, wherein the receiving the PSM_ACK signal and the PLL_DISABLE signal and using the received PSM_ACK and PLL_DISABLE signals to produce the PLL_EN signal comprises:
- receiving the PSM_ACK signal and the PLL_DISABLE signal and using the received PSM_ACK and PLL_DISABLE signals to produce a phased lock loop enable (PLL_EN) signal, wherein the PSM_ACK signal and the PLL_DISABLE signal are active high signals such that the PSM_ACK signal and the PLL_DISABLE signal are logic 1 levels when asserted, and wherein the PLL_EN signal is an active low signal such that the PLL_EN signal is a logic 0 level in the event the PSM_ACK signal is a logic 1 level and the PLL_DISABLE signal is a logic 1 level.

13. The method as recited in claim 11, wherein the receiving the PLL_OUT signal and using the PLL_OUT signal to produce a LOCK signal dependent upon the PLL_OUT signal comprises:
- receiving the PLL_OUT signal and using the PLL_OUT signal to produce a LOCK signal dependent upon the PLL_OUT signal, wherein the LOCK signal is indicative of whether the PLL_OUT signal is locked to the REF_CLK signal in terms of both frequency and phase, and wherein the LOCK signal is an active low signal such that the LOCK signal is a logic 0 level when the PLL_OUT signal is locked to the REF_CLK signal in terms of both frequency and phase.

14. The method as recited in claim 13, wherein the receiving the PLL_OUT signal and the LOCK signal and producing the PLL_OUT signal as the CLK signal dependent upon the LOCK signal comprises:
- receiving the PLL_OUT signal and the LOCK signal and producing the PLL_OUT signal as the CLK signal in the event the LOCK signal is a logic 0 level.

15. An apparatus, comprising:
- means for receiving a power save mode acknowledge (PSM_ACK) signal and responding to the PSM_ACK signal by producing a phased lock loop disable (PLL_DISABLE) signal, wherein the PSM_ACK signal is asserted in a power saving mode;
- means for receiving the PSM_ACK signal and the PLL_DISABLE signal and using the received PSM_ACK and PLL_DISABLE signals to produce a phased lock loop enable (PLL_EN) signal;
- means for receiving a reference clock (REF_CLK) signal and the PLL_EN signal and using the REF_CLK signal to produce a phased lock loop output (PLL_OUT) signal responsive to the PLL_EN signal;
- means for receiving the PLL_OUT signal and using the PLL_OUT signal to produce a LOCK signal dependent upon the PLL_OUT signal, wherein the LOCK signal is indicative of whether the PLL_OUT signal is locked to the REF_CLK signal in terms of both frequency and phase; and
- means for receiving the PLL_OUT signal and the LOCK signal and producing the PLL_OUT signal as a clock (CLK) signal dependent upon the LOCK signal.

16. The apparatus as recited in claim 15, wherein the means for receiving the PSM_ACK signal and the PLL_DISABLE signal and using the received PSM_ACK and PLL_DISABLE signals to produce the PLL_EN signal comprises a NAND logic gate.

17. The apparatus as recited in claim 15, wherein the means for receiving the REF_CLK signal and the PLL_EN signal and using the REF_CLK signal to produce the PLL_OUT signal responsive to the PLL_EN signal comprises a phased lock loop (PLL) unit.

18. The apparatus as recited in claim 15, wherein the means for receiving the PLL_OUT signal and using the PLL_OUT signal to produce a LOCK signal dependent upon the PLL_OUT signal comprises a lock detector unit.

19. The apparatus as recited in claim 15, wherein the means for receiving the PLL_OUT signal and the LOCK signal and producing the PLL_OUT signal as the CLK signal dependent upon the LOCK signal comprises a NOT logic gate and an AND logic gate.

* * * * *